(12) United States Patent
Huang et al.

(10) Patent No.: US 10,885,604 B2
(45) Date of Patent: Jan. 5, 2021

(54) METHOD FOR 3D WAVEFORM MAPPING OF FULL-PARALLEL STRUCTURE

(71) Applicant: University of Electronic Science and Technology of China, Sichuan (CN)

(72) Inventors: Wuhuang Huang, Sichuan (CN); Pan Wang, Sichuan (CN); Jun Jiang, Sichuan (CN); Peng Ye, Sichuan (CN); Kuojun Yang, Sichuan (CN); Lianping Guo, Sichuan (CN); Hao Zeng, Sichuan (CN); Shuo Wang, Sichuan (CN); Jian Gao, Sichuan (CN)

(73) Assignee: UNIVERSITY OF ELECTRONIC SCIENCE AND TECHNOLOGY OF CHINA, Sichuan (CN)

( * ) Notice: Subject to any disclaimer, the term of this patent is extended or adjusted under 35 U.S.C. 154(b) by 0 days.

(21) Appl. No.: 16/435,465

(22) Filed: Jun. 8, 2019

(65) Prior Publication Data
US 2019/0392551 A1   Dec. 26, 2019

(30) Foreign Application Priority Data

Jun. 21, 2018   (CN) .......................... 2018 1 0643986

(51) Int. Cl.
*G01R 13/02*   (2006.01)
*G01R 13/40*   (2006.01)
(Continued)

(52) U.S. Cl.
CPC .............. *G06T 1/60* (2013.01); *G01R 13/029* (2013.01); *G01R 13/0272* (2013.01);
(Continued)

(58) Field of Classification Search
CPC .... G01R 13/00; G01R 13/02; G01R 13/0209; G01R 13/0227; G01R 13/0236;
(Continued)

(56) References Cited

U.S. PATENT DOCUMENTS

| 8,648,887 B2 | 2/2014 | Tian et al. | |
|---|---|---|---|
| 2009/0309879 A1* | 12/2009 | Gorbics | G01R 13/0227 345/440.1 |
| 2018/0149676 A1 | 5/2018 | Yang et al. | |

OTHER PUBLICATIONS

Yang, Kuojun, et al. "A seamless acquisition digital storage oscilloscope with three-dimensional waveform display" Review of Scientific Instruments 85.4 (2014): 045102 (Year: 2014).*

* cited by examiner

*Primary Examiner* — Diane M Wills
(74) *Attorney, Agent, or Firm* — Yue (Robert) Xu; Apex Attorneys at Law, LLP

(57) ABSTRACT

The present invention provides a method for 3D waveform mapping of full-parallel structure, first, a 3D waveform mapping database is created according to the size of a 3D waveform image, the number of bits of probability value and the ADC's resolution of data acquisition module, then the 3D waveform mapping database is divided into $M_t \times M_a$ independent mapping storage areas along the time axis and the amplitude axis, and each independent mapping storage area is assigned a RAM, then RAMs are selected and addresses are calculated based on the sampling values and the structure of created 3D waveform mapping database, finally, parallel mappings are performed simultaneously on the time axis and the amplitude axis according to the selected RAMs and calculated addresses. Thus, the mapping time are shorten, especially in vector mapping mode, several RAMs are used for mapping, so the WCR of DSO is improved.

2 Claims, 4 Drawing Sheets

(51) Int. Cl.
*G06T 11/20* (2006.01)
*G06T 1/60* (2006.01)
*G06F 16/22* (2019.01)
*G06F 3/06* (2006.01)

(52) U.S. Cl.
CPC .......... *G06F 3/0604* (2013.01); *G06F 3/0659* (2013.01); *G06F 3/0673* (2013.01); *G06F 16/2264* (2019.01); *G06T 11/206* (2013.01); *G06T 2200/28* (2013.01)

(58) Field of Classification Search
CPC ............ G01R 13/0245; G01R 13/0254; G01R 13/0272; G01R 13/029; G01R 13/206; G01R 13/408; G06F 3/05; G06F 5/06; G06F 3/0604; G06F 3/0659; G06F 3/0673; G06F 16/2264; G06T 1/60; G06T 11/206
See application file for complete search history.

| RAM $R_{00}$ | RAM $R_{10}$ | ...... | RAM $R_{i0}$ | ..... | RAM $R_{(M_t-1)0}$ |
|---|---|---|---|---|---|
| RAM $R_{01}$ | RAM $R_{11}$ | ...... | RAM $R_{i2}$ | ..... | RAM $R_{(M_t-1)1}$ |
| ⋮ | ⋮ | ⋮ | ⋮ | ⋮ | ⋮ |
| RAM $R_{0j}$ | RAM $R_{1j}$ | ...... | RAM $R_{ij}$ | ..... | RAM $R_{(M_t-1)j}$ |
| ⋮ | ⋮ | ⋮ | ⋮ | ⋮ | ⋮ |
| RAM $R_{0(M_a-1)}$ | RAM $R_{1(M_a-1)}$ | ...... | RAM $R_{i(M_a-1)}$ | ..... | RAM $R_{(M_t-1)(M_a-1)}$ |

US 10,885,604 B2

METHOD FOR 3D WAVEFORM MAPPING OF FULL-PARALLEL STRUCTURE

This application claims priority under the Paris Convention to Chinese Patent Application No. 201810643986.2, filed on Jun. 21, 2018, the entirety of which is hereby incorporated by reference for all purposes as if fully set forth herein.

FIELD OF THE INVENTION

The present invention relates to the field of waveform display, more particularly to a method for 3D waveform mapping of full-parallel structure.

BACKGROUND OF THE INVENTION

Three-dimensional (3D) waveform display is one of the main functions of 3D digital storage oscilloscope (DSO). 3D waveform image displayed on screen can provide not only the time information and the amplitude information of a waveform, but also the occurrences (probability) information of the waveform, which is indicated by different levels of luminance. Usually, 3D waveform display is realized through 3D waveform mapping, which improves the waveform capture rate (WCR) of DSO. WRC is one of the key performance specifications of DSO. The higher the WRC is, the higher the probability that the complex signals such as burst signal and burr signal am captured will be.

As shown in FIG. 1, the overall process of 3D waveform mapping is: under the control of system control module 8, data acquisition module 1 acquires an input signal and sends the sampling values to FIFO memory 2, after FIFO memory 2 is full, 3D waveform mapping module 3 starts to map the sampling values in FIFO memory 2: calculate the address of each sampling value in 3D database 4 according to the mapping relation between the sampling value and the address of 3D database 4, then read out the probability value (initial value is 0) from the storage unit of the calculated address in 3D database 4, add 1 to the probability value, and write the added probability value back to the storage unit of the calculated address in 3D database 4. When all the sampling values in FIFO memory 2 are mapped, the acquisition and mapping of the next frame of waveform starts. The acquisition and mapping is performed repeatedly, until a screen refresh signal update arrives. After the current frame of waveform is mapped, the probability values in 3D database 4 are read out and processed in 3D digital imager 5 to obtain a 3D waveform image. The 3D waveform image is sent to display module 6 and displayed on the screen 7 of a DSO (the screen usual is a LCD). the value in each storage unit of 3D database 4 represents the number that the sampling point of waveform occurs at each point in time and amplitude, i.e. a probability value.

3D waveform mapping has two mapping modes: point mapping and vector mapping. The basic process of vector mapping is similar with that of point mapping. The main difference is the way of generating the mapping address in 3D database. In point mapping mode, a sampling value is mapped into a corresponding address. However in vector mapping mode, a sampling value is mapped into a section of continuous addresses.

The conventional 3D waveform mapping uses serial mapping to process the sampling values. Only one 3D database is used for 3D waveform mapping. Only when the mapping of current sampling value is finished, the mapping of next sampling value can be started. And the mapping of a sampling value needs three processes: reading out, adding and writing back, which will spend at least 5 system clock periods. The processes of the conventional 3D waveform mapping are simple, however, the time consumption is heavy, which greatly limits the improvement of WCR.

The WCR is pertinent to the time consumption of acquisition, mapping and display of waveform. So, we can reduce the time consumption of mapping to increase the acquired frames of waveform in a unit time (usually one second), i.e. WCR.

In order to improve the WCR of DSO, as shown in FIG. 2, parallel 3D waveform mapping has been proposed in related document, which divides the 3D database into M parallel databases. Thus, M sampling values stored in FIFO_0, FIFO_1, FIFO_2, . . . , FIFO_M−1 can be mapped respectively into Parallel Database_0, Parallel Database_1, Parallel Database_2, . . . , Parallel Database_M−1 at a time point, i.e. parallel 3D waveform mapping has been realized at a time point, where A is amplitude, P is probability value, t is time.

The above mentioned parallel 3D waveform mapping has reduced the time consumption of mapping a frame of waveform K times in point mapping mode. However, in vector mapping mode, when mapping a complex signal which has an amplitude difference of $2^N$ (N is the resolution of ADC) at two consecutive time points, a mapping of $2^N$ sampling values is needed at a time point, which leads to a sharp time increase in the vector mapping for one frame of waveform. Thus, under the same screen refresh period, the acquired and mapped frames of waveform reduce sharply, which leads to little effect on 3D waveform display.

SUMMARY OF THE INVENTION

The present invention aims to overcome the deficiencies of the prior art and provides a method for 3D waveform mapping of full-parallel structure to shorten the mapping time, especially in vector mapping mode, so as to improve the WCR of DSO.

To achieve these objectives, in accordance with the present invention, a method for 3D waveform mapping of full-parallel structure is provided, comprising:

(1). creating a 3D waveform mapping database, where the size of the 3D waveform mapping database is $L \times 2^N \times B/8$ (byte), L and $2^N$ are respectively the length and the width of a 3D waveform image, B is the number of bits of probability value, N is the ADC's (Analog-to-Digital Converter's) resolution of a data acquisition module;

(2). dividing the 3D waveform mapping database into, vertical mapping storage areas along the time axis and $M_a$ horizontal mapping storage areas along the amplitude axis, thus $M_t \times M_a$ independent mapping storage areas am obtained, where an independent mapping storage area is represented by $S_{ij}$, i is the serial number of the independent mapping storage area on the time axis, i=0, 1, . . . , $M_t$−1, j is the serial number of the independent mapping storage area on the amplitude axis, j=0, 1, . . . , $M_a$−1;

assigning a random access memory (RAM) for each independent mapping storage area, where the size of the RAM is $W_{data} \times T_{addr}$, $W_{data}$ is the bit width of data of the RAM, and $W_{data}$=B, $T_{addr}$ is the address length of the RAM, and $T_{addr} = (L \times 2^N)/(M_t \times M_a)$, the RAM for independent mapping storage area $S_{ij}$ is represented by $R_{ij}$;

(3). 3D waveform mapping based on full-parallel structure: performing step 3.1) or step 3.2)

3.1). point mapping:

3.1.1). initializing serial number k of read to 0;

3.1.2). parallel reading out $M_t$ sampling values from a FIFO memory in which the sampling values acquired by the data acquisition module are stored, then selecting a RAM $R_{ij}$ for each sampling value $Y_{kl}$, l=0, 1, . . . , $M_t$-1, according to the following equations:

$$i=l, j=\lfloor Y_{kl}/M_a \rfloor;$$

where l is the serial number of sampling value $Y_{kl}$, $\lfloor \ \rfloor$ is the operator of downward rounding;

3.1.3). calculating a physical address $A_{kl}$ for each sampling value $Y_{kl}$, l=0, 1, . . . , $M_t$-1 according to the following equation:

$$A_{kl} = \left[\frac{2^N}{M_a} \times (k+1) - 1\right] - (Y_{kl} \% M_a)$$

where % is the operator of Mod;

3.1.4). parallel updating the probability values of the storage units for the $M_t$ sampling values: for each sampling value $Y_{kl}$, reading out a probability value (initial value is 0) from a storage unit according to physical address $A_{kl}$ in RAM $R_{ij}$, and adding 1 to the probability value, then writing the added probability value back to the storage unit;

3.1.5). setting serial number k of read to k+1, and returning to step 3.1.2, until L sampling values have been mapped;

3.1.6). returning to step 3.1.1, until a screen refresh signal arrives;

3.2). vector mapping:

3.2.1). initializing serial number k of read to 0;

3.2.2). when in normal sampling mode, parallel reading out $M_t$ sampling values from a FIFO memory in which the sampling values acquired by the data acquisition module are stored, then selecting $M_t$ pairs of maximum values and minimum values $Y_{kl,max}$, $Y_{kl,min}$, l=0, 1, . . . , $M_t$-1, according to the following rules:

$$\begin{cases} Y_{kl,max} = Y_{kl,min} = Y_{kl} & \text{if } l = k = 0; \\ Y_{kl,max} = \max(Y_{(k-1)(M_t-1)}, Y_{kl}), \\ Y_{kl,min} = \min(Y_{(k-1)(M_t-1)}, Y_{kl}) & \text{if } l = 0, k \geq 1; \\ Y_{kl,max} = \max(Y_{k(l-1)}, Y_{kl}), \\ Y_{kl,min} = \min(Y_{k(l-1)}, Y_{kl}) & \text{if } l \geq 1; \end{cases}$$

where l is the serial number of sampling value $Y_{kl}$, $Y_{(k-1)(M_t-1)}$ is the $(M_t-1)^{th}$ sampling value in $(k-1)^{th}$ read, $Y_{k(l-1)}$ is the $(l-1)^{th}$ sampling value in $k^{th}$ read;

when in extraction mode, parallel reading out $M_t$ groups of sampling values from a FIFO memory in which the sampling values acquired by the data acquisition module are stored, where each group of sampling values has $M_{ext}$ sampling values, $M_{ext}$ is the extracting multiple; selecting a maximum value and a minimum value from each group of sampling values, where the maximum value and the minimum value are respectively represented by $Y_{kl,max}$, $Y_{kl,min}$, l is the serial number of group, l=0, 1, . . . , $M_t$-1; and then adjusting $M_t$ pairs of maximum values and minimum values $Y_{kl,max}$, $Y_{kl,min}$, l=0, 1, . . . , $M_t$-1, according to the following rules:

for maximum value $Y_{k(l+1),max}$, l=0, 1, . . . , $M_t$-2, if $Y_{k(l+1),max} < Y_{kl,min}$, then letting $Y_{k(l+1),max} = Y_{kl,min}$, otherwise keeping it unchanged;

for minimum value $Y_{k(l+1),min}$, l=0, 1, . . . $M_t$-2, if $Y_{k(l+1),min} > Y_{kl,max}$, then letting $Y_{k(l+1),min} = Y_{kl,max}$, otherwise keeping it unchanged;

3.2.3). selecting a RAM $R_{th}$ for each maximum value $Y_{kl,max}$, a RAM $R_{ig}$ for each minimum value $Y_{kl,min}$, l=0, 1, . . . , $M_t$-1, according to the following equations:

$$i=l, h=\lfloor (2^N-1-Y_{kl,max})/M_a \rfloor, g=\lfloor (2^N-1-Y_{kl,min})/M_a \rfloor$$

then selecting RAMs between RAM $R_{th}$ and RAM $R_{ig}$ for each pair of maximum values and minimum values $Y_{kl,max}$, $Y_{kl,min}$;

3.2.4). calculating a physical address $A_{kl,max}$ for each maximum value $Y_{kl,max}$ and a physical address $A_{kl,min}$ for each minimum value $Y_{kl,min}$, l=0, 1, . . . , $M_t$-1, according to the following equations:

$$A_{kl,max} = \left[\frac{2^N}{M_a} \times (k+1) - 1\right] - (Y_{kl,max} \% M_a),$$

$$A_{kl,min} = \left[\frac{2^N}{M_a} \times (k+1) - 1\right] - (Y_{kl,min} \% M_a)$$

3.2.5). parallel updating the probability values of the storage units for the $M_t$ pairs of maximum values and minimum values: for each pair of maximum value and minimum value $Y_{kl,max}$, $Y_{kl,min}$, reading out probability values (initial values are 0) from storage units according to physical address scope $[A_{kl,max}, (2^N/M_a) \times (k+1)-1]$ in RAM $R_{th}$, physical address scope $[(2^N/M_a) \times k, A_{kl,min}]$ in RAM $R_{ig}$ and physical address scope $[(2^N/M_a) \times k, (2^N/M_a) \times (k+1)-1]$ in each RAM between RAM $R_{th}$ and RAM $R_{ig}$, and adding 1 to each of the probability values, writing the added probability values back to their respective storage units;

3.2.6). setting serial number k of read to k+1, and returning to step 3.2.2, until L pairs of maximum values and minimum values have been mapped;

3.2.7). returning to step 3.2.1, until a screen refresh signal arrives.

The objectives of the present invention are realized as follows:

In the present invention i.e. a method for 3D waveform mapping of full-parallel structure, first, a 3D waveform mapping database is created according to the size of a 3D waveform image, the number of bits of probability value and the ADC's resolution of data acquisition module, then the 3D waveform mapping database is divided into $M_t \times M_a$ independent mapping storage areas along the time axis and the amplitude axis, and each independent mapping storage area is assigned a RAM, then RAMs am selected and addresses am calculated based on the sampling values and the structure of created 3D waveform mapping database, finally, parallel mappings are performed simultaneously on the time axis and the amplitude axis according to the selected RAMs and calculated addresses. Thus, the mapping time are shorten, especially in vector mapping mode, several RAMs am used for mapping, so the WCR of DSO is improved.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
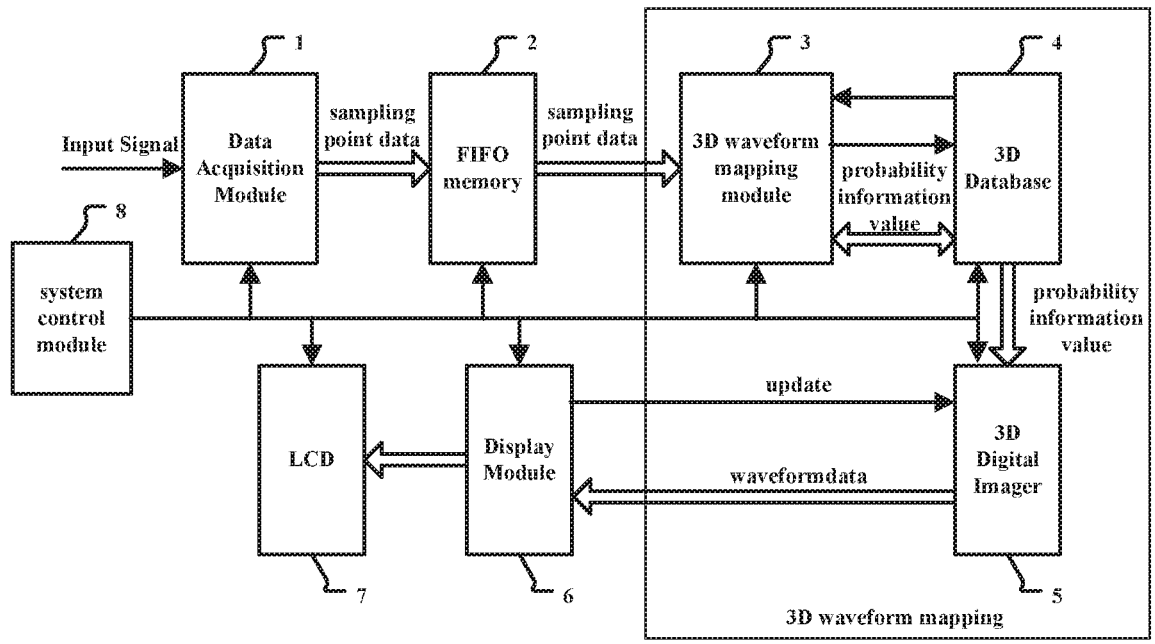
FIG. 1 is a diagram of a 3D digital storage oscilloscope in prior art.
Figure 2:
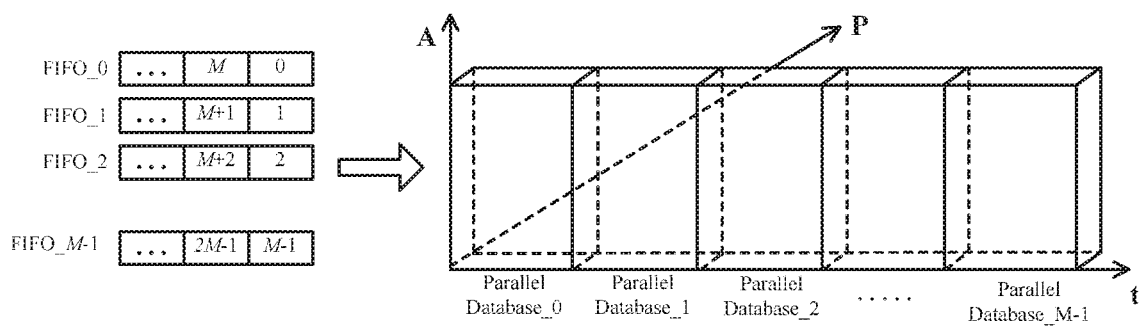
FIG. 2 is a diagram of a parallel 3D waveform mapping in prior art.

Hereinafter, preferred embodiments of the present invention will be described with reference to the accompanying drawings. It should be noted that the similar modules are designated by similar reference numerals although they am illustrated in different drawings. Also, in the following description, a detailed description of known functions and configurations incorporated herein will be omitted when it may obscure the subject matter of the present invention.

Embodiment

Figure 3:
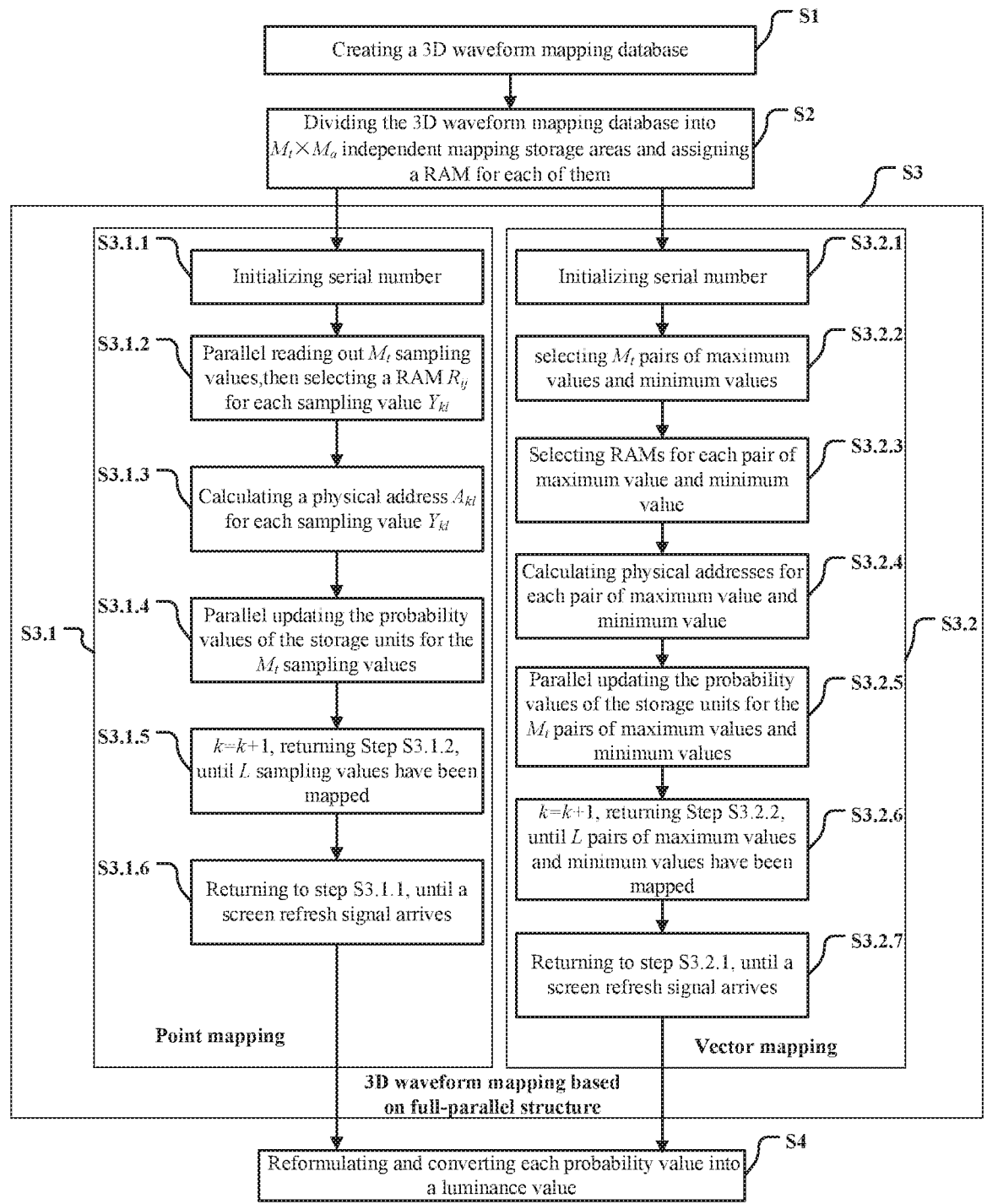
FIG. 3 is a flow diagram of a method for 3D waveform mapping of full-parallel structure in accordance with the present invention.

FIG. 3 is a flow diagram of a method for 3D waveform mapping of full-parallel structure in accordance with the present invention.

In one embodiment, As shown in FIG. 3, a method for 3D waveform mapping of full-parallel structure comprises the following steps:

Step S1: creating a 3D waveform mapping database, where the size of the 3D waveform mapping database is $L \times 2^N \times B/8$ (byte), L and $2^N$ are respectively the length and the width of a 3D waveform image, B is the number of bits of probability value, N is the ADC's resolution of a data acquisition module.

Figure 4:
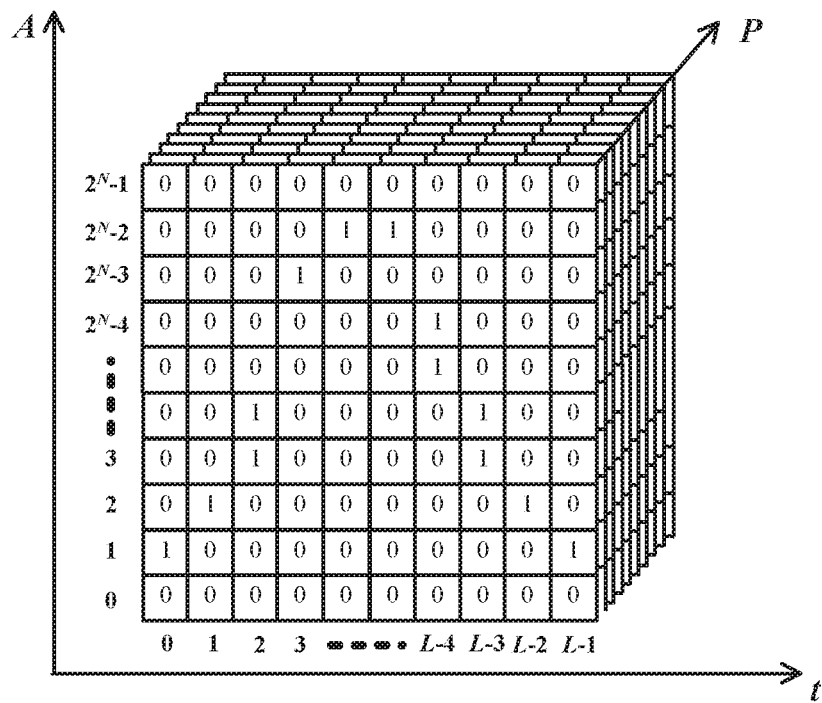
FIG. 4 is a diagram of a typical 3D waveform image.

As shown in FIG. 4, a typical 3D waveform image has L sampling points along the time axis t. The amplitude of each sampling point, i.e. sampling value is between 0 and $2^N$, N is the ADC's resolution of a data acquisition module which acquired the sampling values, thus the length and the width of the 3D waveform image are L and $2^N$ respectively. A dot on 3D waveform image is the number of occurrences, i.e. probability value P of the corresponding amplitude's sampling point at corresponding time. The maximum value of probability value P is $2^B-1$, B is the number of bits of probability value P. then the size of the 3D waveform mapping database is $L \times 2^N \times B/8$ (byte).

Figure 5:
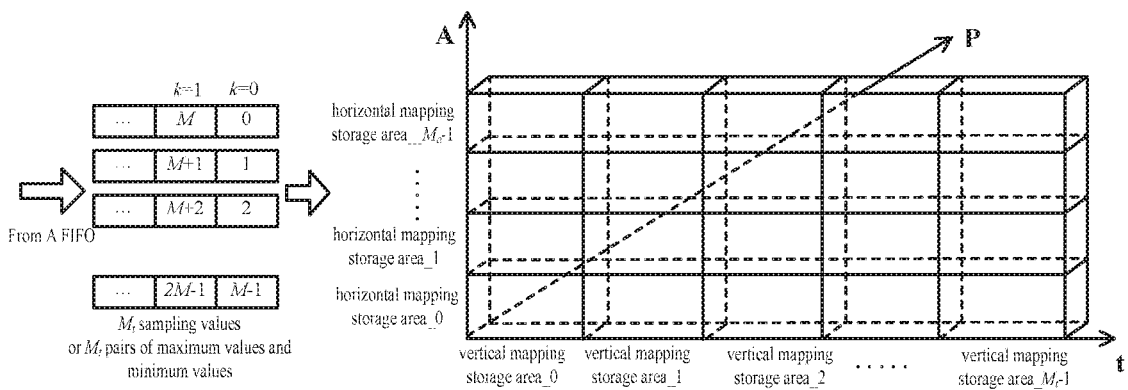
FIG. 5 is a diagram of a 3D waveform mapping database in accordance with the present invention.

Step S2: as shown in FIG. 5, dividing the 3D waveform mapping database into $M_t$ vertical mapping storage areas along the time axis and $M_a$ horizontal mapping storage areas along the amplitude axis, thus $M_t \times M_a$ independent mapping storage areas are obtained, where an independent mapping storage area is represented by $S_{ij}$, i is the serial number of the independent mapping storage area on the time axis, $i=0, 1, \ldots, M_t-1$, j is the serial number of the independent mapping storage area on the amplitude axis, $j=0, 1, \ldots, M_a-1$.

Figures 6, 7:
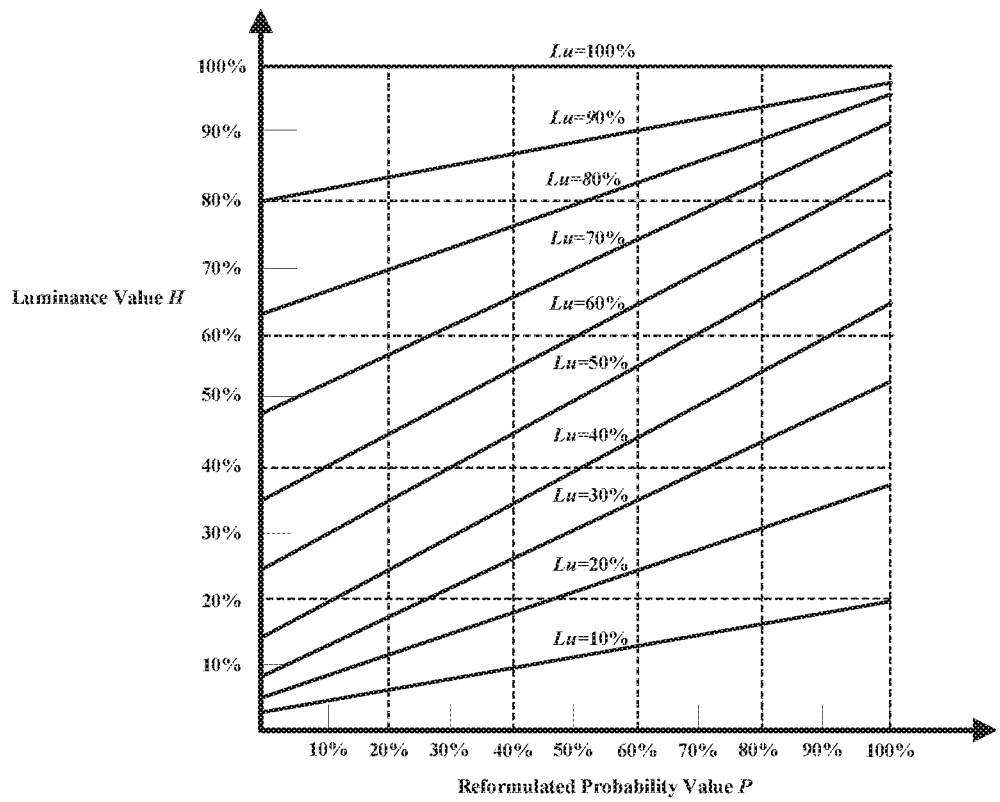
FIG. 6 is a diagram of the layout of RAMs in accordance with the present invention.
FIG. 7 is a diagram of curves of relations between the luminance value and the reformulated probability value at different luminance grades in accordance with the present invention.

As shown in FIG. 6, assigning a random access memory (RAM) for each independent mapping storage area, where the size of the RAM is $W_{data} \times T_{addr}$, $W_{data}$ is the bit width of data of the RAM, and $W_{data}=B$, $T_{addr}$ is the address length of the RAM, and $T_{addr}=(L \times 2^N)/(M_t \times M_a)$, the RAM for independent mapping storage area $S_{ij}$ is represented by $R_{ij}$. Thus, $M_t$ sampling value can be mapped simultaneously on the time axis, $M_a$ probability values can be read and written simultaneously on the amplitude axis.

In one embodiment, $M_t=8$, $M_a=4$, $L=1024$, $N=8$, thus the 3D waveform mapping database is divided into 32 independent mapping storage areas. $L=1024$, $N=8$, thus, the address length of the RAM $T_{addr}=(L \times 2^N)/(M_t \times M_a)=8192$. The bit width of data of the RAM $W_{data}=B=8$, the size of the RAM is 8192×8 (bit).

Step S3: 3D waveform mapping based on full-parallel structure: performing step S3.1 or step S3.2

The 3D waveform display of DSO has two modes: point display and vector display, correspondingly, the waveform mapping has two modes: point mapping and vector mapping. point mapping and vector mapping in present invention am respectively described in details as below.

Step S3.1: point mapping:

Step S3.1.1: initializing serial number k of read to 0;

Step S3.1.2: parallel reading out $M_t$ sampling values from a FIFO memory in which the sampling values acquired by the data acquisition module are stored, then selecting a RAM $R_{ij}$ for each sampling value $Y_{kl}$, $l=0, 1, \ldots, M_t-1$, according to the following equations:

$$i=l, j=\lfloor Y_{kl}/M_a \rfloor;$$

where l is the serial number of sampling value $Y_{kl}$, $\lfloor \ \rfloor$ is the operator of downward rounding.

Step S3.1.3: calculating a physical address $A_{kl}$ for each sampling value $Y_{kl}$, $l=0, 1, \ldots, M_t-1$ according to the following equation:

$$A_{kl} = \left[\frac{2^N}{M_a} \times (k+1) - 1\right] - (Y_{kl} \% M_a)$$

where % is the operator of Mod.

In one embodiment, the sampling values of the $k^{th}$ read is $Y_{kl}$, the RAM for sampling value $Y_{kl}$ is $R_{ij}$, where the $i=l$, $j=\lfloor Y_{kl}/4 \rfloor$, $k=0, 1, 2, \ldots 127$, $l=0, 1, 2, \ldots, 7$, the physical address for sampling value $Y_{kl}$ is $[2^8/4 \times (k+1)-1]-(Y_{kl} \% 4)$.

Step S3.1.4: parallel updating the probability values of the storage units for the $M_t$ sampling values: for each sampling value $Y_{kl}$, reading out a probability value (initial value is 0) from a storage unit according to physical address $A_{kl}$ in RAM $R_{ij}$, and adding 1 to the probability value, then writing the added probability value back to the storage unit.

Step S3.1.5: setting serial number k of read to k+1, and returning to step S3.1.5, until L sampling values have been mapped.

Step S3.1.6: returning to step S3.1.1, until a screen refresh signal arrives.

Step S3.2: vector mapping:

Step S3.2.1: initializing serial number k of read to 0;

Step S3.2.2: when in normal sampling mode, parallel reading out $M_t$ sampling values from a FIFO memory in which the sampling values acquired by the data acquisition module are stored, then selecting $M_t$ pairs of maximum values and minimum values $Y_{kl,max}$, $Y_{kl,min}$, $l=0, 1, \ldots, M_t-1$, according to the following rules:

$$\begin{cases} Y_{kl,max} = Y_{kl,min} = Y_{kl} & \text{if } l=k=0; \\ Y_{kl,max} = \max(Y_{(k-1)(M_t-1)}, Y_{kl}), \\ Y_{kl,min} = \min(Y_{(k-1)(M_t-1)}, Y_{kl}) & \text{if } l=0, k \geq 1; \\ Y_{kl,max} = \max(Y_{k(l-1)}, Y_{kl}), \\ Y_{kl,min} = \min(Y_{k(l-1)}, Y_{kl}) & \text{if } l \geq 1; \end{cases}$$

where l is the serial number of sampling value $Y_{kl}$, $Y_{(k-1)(M_t-1)}$ is the $(M_t-1)^{th}$ sampling value in $(k-1)^{th}$ read, $Y_{k(l-1)}$ is the $(l-1)^{th}$ sampling value in $k^{th}$ read.

when in extraction mode, parallel reading out $M_t$ groups of sampling values from a FIFO memory in which the sampling values acquired by the data acquisition module are stored, where each group of sampling values has $M_{ext}$ sampling values, $M_{ext}$ is the extracting multiple; selecting a maxim value and a minimum value from each group of sampling values, where the maximum value and the minimum value are respectively represented by $Y_{kl,max}$, $Y_{kl,min}$, l is the serial number of group, l=0, 1, ..., $M_t$-1; and then adjusting $M_t$ pairs of maximum values and minimum values $Y_{kl,max}$, $Y_{kl,min}$=0, 1, ..., $M_t$-1, according to the following rules:

for maximum value $Y_{k(k+1),max}$, l=0, 1, ..., $M_t$-2, if $Y_{k(l+1),max} < Y_{kl,min}$, then letting $Y_{k(l+1),max} = Y_{kl,min}$, otherwise keeping it unchanged;

for minimum value $Y_{k(l+1),min}$, l=0, 1, ..., $M_t$-2, if $Y_{k(l+1),min} > Y_{kl,max}$, then letting $Y_{k(l+1),min} = Y_{kl,max}$, otherwise keeping it unchanged.

In one embodiment, the extracting multiple $M_{ext}$ is 16, groups of sampling values $M_t$ is 8.

Step S3.2.3: selecting a RAM $R_{ih}$ for each maximum value $Y_{kl,max}$, a RAM $R_{ig}$ for each minimum value $Y_{kl,min}$, l=0, 1, ..., $M_t$-1, according to the following equations:

$$i=l, h=\lfloor(2^N-1-Y_{kl,max})/M_a\rfloor, g=\lfloor(2^N-1-Y_{kl,min})/M_a\rfloor$$

then selecting RAMs between RAM $R_{ih}$ and RAM $R_{ig}$ for each pair of maximum values and minimum values $Y_{kl,max}$, $Y_{kl,min}$. The RAMs between RAM $R_{ih}$ and RAM $R_{ig}$ can be denoted by $R_{if}$, f=(h+1), (h+1), ..., (g-1).

In one embodiment, i=l, h=$\lfloor(2^8-1-Y_{kl,max})/4\rfloor$, g=$\lfloor(2^8-1-Y_{kl,min})/4\rfloor$.

Step S3.2.4: calculating a physical address $A_{kl,max}$ for each maximum value $Y_{kl,max}$ and a physical address $A_{kl,min}$ for each minimum value $Y_{kl,min}$, l=0, 1, ..., $M_t$-1, according to the following equations:

$$A_{kl,max} = \left[\frac{2^N}{M_a} \times (k+1) - 1\right] - (Y_{kl,max} \% M_a),$$

$$A_{kl,min} = \left[\frac{2^N}{M_a} \times (k+1) - 1\right] - (Y_{kl,min} \% M_a).$$

In one embodiment, $$A_{kl,max} = \left[\frac{2^8}{4} \times (k+1) - 1\right] - (Y_{kl,max} \% 4),$$

$$A_{kl,min} = \left[\frac{2^8}{4} \times (k+1) - 1\right] - (Y_{kl,min} \% 4).$$

Step S3.2.5: parallel updating the probability values of the storage units for the $M_t$ pairs of maximum values and minimum values: for each pair of maximum value and minimum value $Y_{kl,max}$, $Y_{kl,min}$, reading out probability values (initial values are 0) from storage units according to physical address scope $[A_{kl,max}, (2^N/M_a)\times(k+1)-1]$ in RAM $R_{ih}$, physical address scope $[(2^N/M_a)\times k, A_{kl,min}]$ in RAM $R_{ig}$ and physical address scope $[(2^N/M_a)\times k, (2^N/M_a)\times(k+1)-1]$ in each RAM between RAM $R_{ih}$ and RAM $R_{ig}$, and adding 1 to each of the probability values, writing the added probability values back to their respective storage units.

In one embodiment, the physical address scope in RAM $R_{ih}$ is $[A_{kl,max}, (2^8/4)\times(k+1)-1]$, the physical address scope in RAM is $R_{ig}$, $[(2^8/4)\times k, A_{kl,min}]$, the physical address scopein each RAM between RAM $R_{ih}$ and RAM $R_{ig}$ is $[(2^8/4)\times k, (2^8/4)\times(k+1)-1]$.

Step S3.2.6: setting serial number k of read to k+1, and returning to step S3.2.2, until L pairs of maximum values and minimum values have been mapped.

Step S3.2.7: returning to step S3.2.1, until a screen refresh signal arrives.

Step S4: reading out each probability value from each RAM, and reformulating it in term of percentage, then converting it into a luminance value H according to the following equations:

$$\begin{cases} H = c \times P + b \\ c = -2.1515 \times Lu^2 + 2.1515 \times Lu - 0.0167 \\ b = 1.0758 \times Lu^2 - 0.0991 \times L + 0.02 \end{cases}$$

where P is the reformulated probability value, b, c am intermediate values, Lu is a luminance grade which is set by user.

In one embodiment, as shown in FIG. 7, the relations between the luminance value and the reformulated probability value at different luminance grades am liner with different slopes and different start points. the luminance grade Lu of 50% has the maximum slope, which makes the luminance of waveform adjusted at all luminance grades.

While illustrative embodiments of the invention have been described above, it is, of course, understand that various modifications will be apparent to those of ordinary skill in the art. Such modifications am within the spirit and scope of the invention, which is limited and defined only by the appended claims.

What is claimed is:

1. A method for 3D waveform mapping of full-parallel structure, comprising:

(1). creating a 3D waveform mapping database, where the size of the 3D waveform mapping database is $L \times 2^N \times B/8$ (byte), L and $2^N$ are respectively the length and the width of a 3D waveform image, B is the number of bits of probability value, N is the ADC's (Analog-to-Digital Converter's) resolution of a data acquisition module;

(2). dividing the 3D waveform mapping database into $M_t$ vertical mapping storage areas along the time axis and $M_a$ horizontal mapping storage areas along the amplitude axis, thus $M_t \times M_a$ independent mapping storage areas are obtained, where an independent mapping storage area is represented by $S_{ij}$, i is the serial number of the independent mapping storage area on the time axis, i=0, 1, ..., $M_t$-1, j is the serial number of the independent mapping storage area on the amplitude axis, j=0, 1, ..., $M_a$-1;

assigning a random access memory (RAM) for each independent mapping storage area, where the size of the RAM is $W_{data} \times T_{addr}$, $W_{data}$ is the bit width of data of the RAM, and $W_{data}$=B, $T_{addr}$ is the address length of the RAM, and $T_{addr}=(L \times 2^N)/(M_t \times M_a)$, the RAM for independent mapping storage area $S_{ij}$ is represented by $R_{ij}$;

(3). 3D waveform mapping based on full-parallel structure: performing step 3.1) or step 3.2)

3.1). point mapping:

3.1.1). initializing serial number k of read to 0;

3.1.2). parallel reading out $M_t$ sampling values from a FIFO memory in which the sampling values acquired by the data acquisition module are stored, then selecting a RAM $R_{ij}$ for each sampling value $Y_{kl}$, $l=0, 1, \ldots, M_t-1$, according to the following equations:

$$i=l, j=\lfloor Y_{kl}/M_a \rfloor;$$

where l is the serial number of sampling value $Y_{kl}$, $\lfloor \ \rfloor$ is the operator of downward rounding;

3.1.3). calculating a physical address $A_{kl}$ for each sampling value $Y_{kl}$, $l=0, 1, \ldots, M_t-1$ according to the following equation:

$$A_{kl} = \left[\frac{2^N}{M_a} \times (k+1) - 1\right] - (Y_{kl} \% M_a)$$

where % is the operator of Mod;

3.1.4). parallel updating the probability values of the storage units for the $M_t$ sampling values: for each sampling value $Y_{kl}$, reading out a probability value (initial value is 0) from a storage unit according to physical address $A_{kl}$ in RAM $R_{ij}$, and adding 1 to the probability value, then writing the added probability value back to the storage unit;

3.1.5). setting serial number k of read to k+1, and returning to step 3.1.2, until L sampling values have been mapped;

3.1.6). returning to step 3.1.1, until a screen refresh signal arrives;

3.2). vector mapping:

3.2.1). initializing serial number k of read to 0;

3.2.2). when in normal sampling mode, parallel reading out $M_t$ sampling values from a FIFO memory in which the sampling values acquired by the data acquisition module are stored, then selecting $M_t$ pairs of maximum values and minimum values $Y_{kl,max}$, $Y_{kl,min}$, $l=0, 1, \ldots, M_t-1$, according to the following rules:

$$\begin{cases} Y_{kl,max} = Y_{kl,min} = Y_{kl} & \text{if } l = k = 0; \\ Y_{kl,max} = \max(Y_{(k-1)(M_t-1)}, Y_{kl}), \\ Y_{kl,min} = \min(Y_{(k-1)(M_t-1)}, Y_{kl}) & \text{if } l = 0, k \geq 1; \\ Y_{kl,max} = \max(Y_{k(l-1)}, Y_{kl}), \\ Y_{kl,min} = \min(Y_{k(l-1)}, Y_{kl}) & \text{if } l \geq 1; \end{cases}$$

where l is the serial number of sampling value $Y_{kl}$; $Y_{(k-1)(M_t-1)}$ is the $(M_t-1)^{th}$ sampling value in $(k-1)^{th}$ read, $Y_{k(l-1)}$ is the $(l-1)^{th}$ sampling value in $k^{th}$ read;

when in extraction mode, parallel reading out $M_t$ groups of sampling values from a FIFO memory in which the sampling values acquired by the data acquisition module are stored, where each group of sampling values has $M_{ext}$ sampling values, $M_{ext}$ is the extracting multiple; selecting a maximum value and a minimum value from each group of sampling values, where the maximum value and the minimum value are respectively represented by $Y_{kl,max}$, $Y_{kl,min}$, l is the serial number of group, $l=0, 1, \ldots, M_t-1$; and then adjusting $M_t$ pairs of maximum values and minimum values $Y_{kl,max}$, $Y_{kl,min}$, $l=0, 1, \ldots, M_t-1$, according to the following rules:

for maximum value $Y_{k(l+1),max}$, $l=0, 1, \ldots, M_t-2$, if $Y_{k(l+1),max} < Y_{kl,min}$, then letting $Y_{k(l+1),max} = Y_{kl,min}$, otherwise keeping it unchanged;

for minimum value $Y_{k(l+1),min}$, $l=0, 1, \ldots, M_t-2$, if $Y_{k(l+1),min} > Y_{kl,max}$, then letting $Y_{k(l+1),min} = Y_{kl,max}$, otherwise keeping it unchanged;

3.2.3). selecting a RAM $R_{ih}$ for each maximum value $Y_{kl,max}$, a RAM $R_{ig}$ for each minimum value $Y_{kl,min}$, $l=0, 1, \ldots, M_t-1$, according to the following equations:

$$i=l, h=\lfloor (2^N-1-Y_{kl,max})/M_a \rfloor, g=\lfloor (2^N-1-Y_{kl,min})/M_a \rfloor$$

then selecting RAMs between RAM $R_{ih}$ and RAM $R_{ig}$ for each pair of maximum values and minimum values $Y_{kl,max}$, $Y_{kl,min}$;

3.2.4). calculating a physical address $A_{kl,max}$ for each maximum value $Y_{kl,max}$ and a physical address $A_{kl,min}$ for each minimum value $Y_{kl,min}$, $l=0, 1, \ldots, M_t-1$, according to the following equations:

$$A_{kl,max} = \left[\frac{2^N}{M_a} \times (k+1) - 1\right] - (Y_{kl,max} \% M_a),$$

$$A_{kl,min} = \left[\frac{2^N}{M_a} \times (k+1) - 1\right] - (Y_{kl,min} \% M_a)$$

3.2.5). parallel updating the probability values of the storage units for the $M_t$ pairs of maximum values and minimum values: for each pair of maximum value and minimum value $Y_{kl,max}$, $Y_{kl,min}$, reading out probability values (initial values are 0) from storage units according to physical address scope $[A_{kl,max}, (2^N/M_a) \times (k+1)-1]$ in RAM $R_{ih}$, physical address scope $[(2^N/M_a) \times k, A_{kl,min}]$ in RAM $R_{ig}$ and physical address scope $[(2^N/M_a) \times k, (2^N/M_a) \times (k+1)-1]$ in each RAM between RAM $R_{ih}$ and RAM $R_{ig}$, and adding 1 to each of the probability values, writing the added probability values back to their respective storage units;

3.2.6). setting serial number k of read to k+1, and returning to step 3.2.2, until L pairs of maximum values and minimum values have been mapped;

3.2.7). returning to step 3.2.1, until a screen refresh signal arrives.

2. A method for 3D waveform mapping of full-parallel structure of claim 1, further comprising:

(4). reading out each probability value from each RAM, and reformulating it in term of percentage, then converting it into a luminance value H according to the following equations:

$$\begin{cases} H = c \times P + b \\ c = -2.1515 \times Lu^2 + 2.1515 \times Lu - 0.0167 \\ b = 1.0758 \times Lu^2 - 0.0991 \times L + 0.02 \end{cases}$$

where P is the reformulated probability value, b, c are intermediate values, Lu is a luminance grade which is set by user.

* * * * *